United States Patent
Desu et al.

(10) Patent No.: US 7,395,522 B2
(45) Date of Patent: Jul. 1, 2008

(54) YIELD PROFILE MANIPULATOR

(75) Inventors: ChandraSekhar Desu, Gresham, OR (US); Nima A. Behkami, Portland, OR (US); Bruce J. Whitefield, Camas, WA (US); David A. Abercrombie, Gresham, OR (US); David J. Sturtevant, Gresham, OR (US)

(73) Assignee: LSI Corporation, Milpitas, CA (US)

( * ) Notice: Subject to any disclaimer, the term of this patent is extended or adjusted under 35 U.S.C. 154(b) by 850 days.

(21) Appl. No.: 10/801,310

(22) Filed: Mar. 16, 2004

(65) Prior Publication Data

US 2005/0229144 A1 Oct. 13, 2005

(51) Int. Cl.
*G06F 17/50* (2006.01)
(52) U.S. Cl. .......................................... 716/19; 716/21
(58) Field of Classification Search ............. 716/19–21; 355/72, 52; 356/237.2, 401; 382/141, 144, 382/149; 430/5, 22, 30
See application file for complete search history.

(56) References Cited

U.S. PATENT DOCUMENTS

| | | | | |
|---|---|---|---|---|
| 6,809,802 B1 * | 10/2004 | Tsukamoto et al. | ............ | 355/72 |
| 2004/0126004 A1 * | 7/2004 | Kikuchi | ...................... | 382/141 |
| 2005/0146714 A1 * | 7/2005 | Kitamura et al. | .......... | 356/237.2 |
| 2005/0190349 A1 * | 9/2005 | Leroux | ........................ | 355/52 |
| 2006/0033917 A1 * | 2/2006 | Leroux et al. | ............... | 356/401 |
| 2007/0072091 A1 * | 3/2007 | Smith et al. | ..................... | 430/5 |

* cited by examiner

*Primary Examiner*—Paul Dinh
(74) *Attorney, Agent, or Firm*—Luedeka, Neely & Graham

(57) ABSTRACT

A graphical profile map for integrated circuits on a substrate. The graphical profile map includes a depiction of die placement boundaries and shot placement boundaries for the integrated circuits on the substrate. Also included are integrated circuit property information contours, where the contours are not limited to either of the die placement boundaries or the shot placement boundaries. In this manner, three key pieces of information for the integrated circuits are presented, including integrated circuit property information, die placement, and shot placement. Because these three pieces of information are presented in a graphical form, it is much easier to interpret the information. For example, it is much easier to determine which shot and die placements have properties that are at risk, and which shot and die placements have adequate property profiles.

12 Claims, 3 Drawing Sheets

YIELD PROFILE MANIPULATOR

FIELD

This invention relates to the field of integrated circuit fabrication. More particularly, this invention relates to tracking and predicting properties of integrated circuits, such as yield, based on location of the integrated circuits on the substrate on which they are fabricated.

BACKGROUND

The processes by which integrated circuit are fabricated are extremely complex. For the present purposes, integrated circuits include devices such as those formed on monolithic semiconducting substrates, such as group IV materials like silicon or germanium or mixtures of such, or group III-V compounds such as gallium arsenide. Because the processes are so complex, there are an extreme number of variables that can effect the final outcome of a process, even when measured against a criterion as generalized as "pass" or "fail."

For this reason, engineers attempt to limit the variability of as many processing parameters as possible, and then attempt to strictly monitor and control the dramatically fewer in number parameters which may need to be modified from time to time. Typically, the various dependent parameters that change in value with a given process are carefully monitored, and may even be charted, such as on a statistical process control chart, so that the engineer can more readily determine whether one or more of the myriad independent parameters on which the process depends has shifted or otherwise gone out of control.

Semiconductor manufactures make integrated circuits by placing repeated patterns of devices on the substrates. The patterned devices are typically rectangular, and are generally disposed in a rectilinear array on a circular substrate. How the device array is placed on the substrate tends to effect the number of whole devices that can fit on the substrate, which in turn effects the total possible number of devices that can be obtained from that substrate. Thus, obtaining a maximum number of whole devices on a substrate is one consideration in deciding how to place the device array on the substrate. However, there are often other things to be considered when deciding how to place the device array on the substrate, such as the number of exposure fields that are required to produce the device array, which in turn effects lithography cell throughput, and what portions of the substrate tend to produce a higher yield or other properties than other portions, which also effects the total device yield of the substrate.

There are at least two problems inherent in the process described above. The first problem is to determine the placement of the devices so as to optimize a given integrated circuit property. The second problem is to determine an overall optimum layout that considers the tradeoffs between the various competing properties that may be dependent on the layout of the devices, but which typically do not have the same optimum layout.

What is needed, therefore, is a system for calculating and displaying an optimum device layout when multiple optimization factors are considered.

SUMMARY

The above and other needs are met by a graphical profile map for integrated circuits on a substrate. The graphical profile map includes a depiction of die placement boundaries and shot placement boundaries for the integrated circuits on the substrate. Also included are integrated circuit property information contours, where the contours are not limited to either of the die placement boundaries or the shot placement boundaries.

In this manner, three key pieces of information for the collection of integrated circuits are presented, including integrated circuit properties, die placement, and shot placement. Because these three pieces of information are presented in a graphical form, it is much easier to interpret the information. For example, it is much easier to determine which shot and die placements have properties that are at risk, and which shot and die placements have adequate property profiles. Thus, the graphical profile map according to the present invention allows an engineer, for example, to determine an optimum shot and die placement based on the displayed property contours.

In various embodiments, the integrated circuit property information is provided from a database of historical integrated circuit property information when a desired amount of historical integrated circuit property information is available, and when the desired amount of historical integrated circuit property information is not available, the integrated circuit property information is provided by programmable algorithms. Preferably, the programmable algorithms comprise modification algorithms and smoothing algorithms. The graphical profile map is preferably stored as an image file, such as a jpeg, gif, tiff, etc, on a computer readable media. In different embodiments, the integrated circuit property information comprises composite integrated circuit property information for all processes that the integrated circuits have undergone, or for a selectable single process that the integrated circuits have undergone, or for a selectable subset of processes that the integrated circuits have undergone.

The integrated circuit property information is preferably presented by representing different integrated circuit property information ranges with different colors. The die placement information preferably comprises a graphical die grid representation, the shot placement information preferably comprises a graphical shot grid representation. The integrated circuit property information is yield information in one embodiment. Preferably there is included a graphical indication depicting an offset from a center of the substrate to a center of a closest unit of the shot placement information.

According to another aspect of the invention there is described a method of creating a graphical profile map for integrated circuits on a substrate, including assembling die placement information for the integrated circuits on the substrate, and displaying the die placement information as die placement boundaries on a representation of the substrate. Shot placement information for the integrated circuits on the substrate is also assembled, and the shot placement information is displayed as shot placement boundaries on the representation of the substrate. Integrated circuit property information for the integrated circuits on the substrate is assembled, and the integrated circuit property information is displayed as contours on the representation of the substrate, where the contours are not limited to either of the die placement boundaries or the shot placement boundaries.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
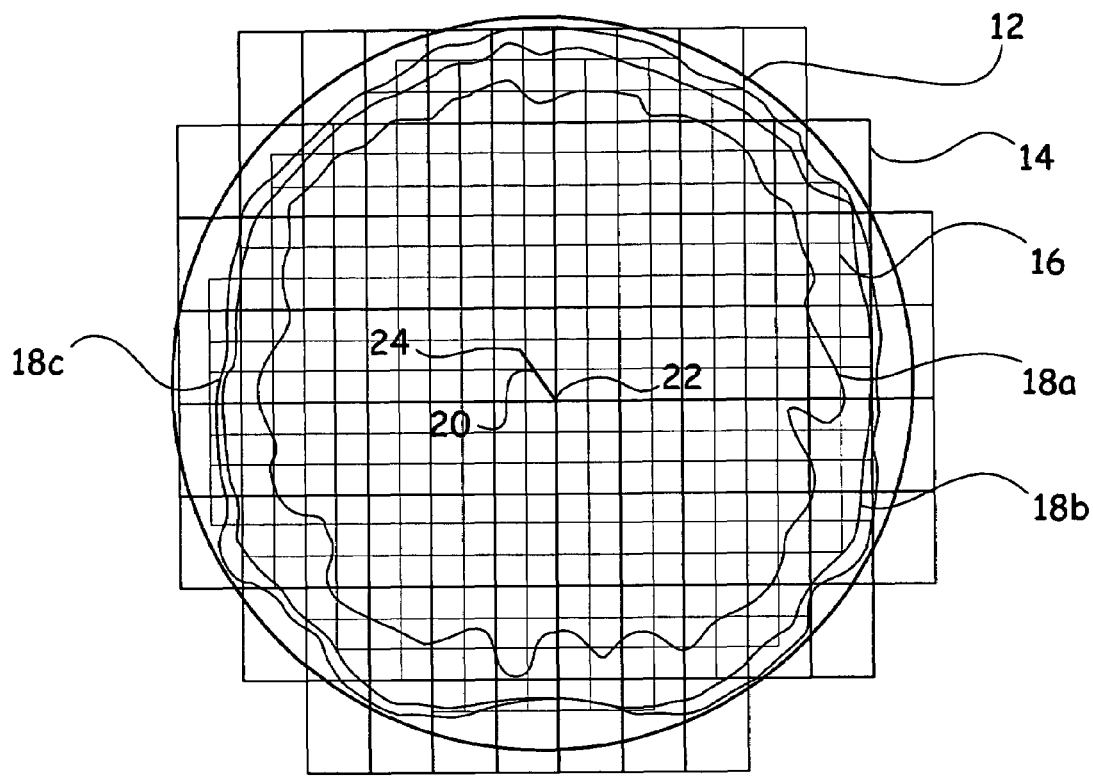
FIG. 1 is a depiction of a graphical profile map according to a preferred embodiment of the invention.

With reference now to FIG. 1 there is depicted a graphical profile map 10 according to a preferred embodiment of the invention. The graphical profile map 10 presents three important information sets overlaid one atop another, in a manner where the relationships between the information sets are more readily observed. The graphical profile map 10 is preferably produced as described herein for integrated circuits on a substrate 12, on which the integrated circuits are fabricated. Most preferably the substrate is formed of a semiconducting material, such as a group IV material like silicon or germanium or a mixture of such, or a group III-V material such as gallium arsenide. The integrated circuits may be of any functional type, such as logic or memory.

The first information set is information in regard to integrated circuit placement on the substrate 12. This information is most preferably a die grid 16 that is overlaid on the substrate 12, and which depicts the locations of the individual dice as they are formed on the substrate 12. The second information set is information in regard to integrated circuit offset on the substrate 12. This information is most preferably a shot grid 14 that is overlaid on the substrate 12, and which depicts the locations of multiple dice as arranged in a stepping mask or reticle by which the patterns for the integrated circuits are formed on the substrate 12.

The third information set is integrated circuit property information such as overall yield, leakage, layer thickness, surface roughness, stoichiometry, drive current, or any one or more of a number of different properties related to integrated circuits. The integrated circuit property information is generally indicated with contours such as 18a, 18b, and 18c, which are representative of ranges of integrated circuit property information values. For example, and to use yield as an example, those integrated circuits that are disposed within the contour generally indicated as 18a may be those integrated circuits for which yield is greater than 99%. Those integrated circuits that are disposed between the contour indicated as 18a and the contour indicated as 18b may be those integrated circuits for which yield is greater than 50% but no more than 99%. Further, those integrated circuits that are disposed between the contour indicated as 18b and the contour indicated as 18c may be those integrated circuits for which yield is greater than 25% but no more than 50%. Finally, those integrated circuits that are disposed outside of the contour indicated as 18c may be those integrated circuits for which yield is no more than 25%.

It is appreciated that in actual use, there may selectively be a fewer number, or more preferably a far greater number of contours 18 used, which contours 18 would preferably indicate integrated circuit property information ranges that are of finer resolution than 50% or 25% of yield, for example. Preferably, the number of contours 18 desired for the graphical profile map 10 can be specified by the user. Most preferably, the different contours 18 are displayed as colored regions, so that they are more readily identified one from another.

The contours 18 are preferable constructed without regard to the die boundaries 16 and the shot boundaries 14. This is accomplished using one or more of a variety of methods. Some of the integrated circuit property information is not limited to a single device, and thus in not inherently device dependent. Such information then does not tend to follow a profile that is dependent on shot and die boundaries, and thus nothing in particular needs to be done to break such information free of such boundaries. Other information, such as gate properties, tends to have many data points within a given device boundary, but the various data points typically will not have the exact same value. Therefore, contours for such property information will naturally cut through device and shot boundaries. Other property data may be very device dependent, such as pass/fail yield for a device. However, using statistical and other methods, such information can be smoothed, such as by using a smoothing algorithm, to better represent an expected yield for a given portion of the substrate 12, where the yield contour 18 cuts through device and shot boundaries.

The graphical profile map 10 also preferably includes a graphical line 20 that extends from the center 22 of the substrate 12 to the center 24 of the closest individual shot 14, and represents the offset between the die grid 16 and the shot grid 14. Such information can be used, for example, to change the shot and die placement on the substrate 12, so that a greater number of integrated circuits are placed in those portions of the substrate 12 where the properties are optimum for integrated circuit yield. Such optimized placement may be different from a placement that is determined merely by maximizing the number of whole devices on the substrate, for example. In another embodiment, the contours 18 for many different properties are depicted on the map 10, where the contours 18 are differentiated one from another in some manner, so that their information is not confounded. For example, contours 18 for different property sets could be depicted using different line weights or dash patterns.

Thus, the graphical profile map 10 provides a depiction of information sets in a selection and arrangement that has not been previously made. As such, the graphical profile map 10 enables the interactions between such information sets to be more readily observed, which enables the information to be more readily used in predictions of future yields.

Figure 2:
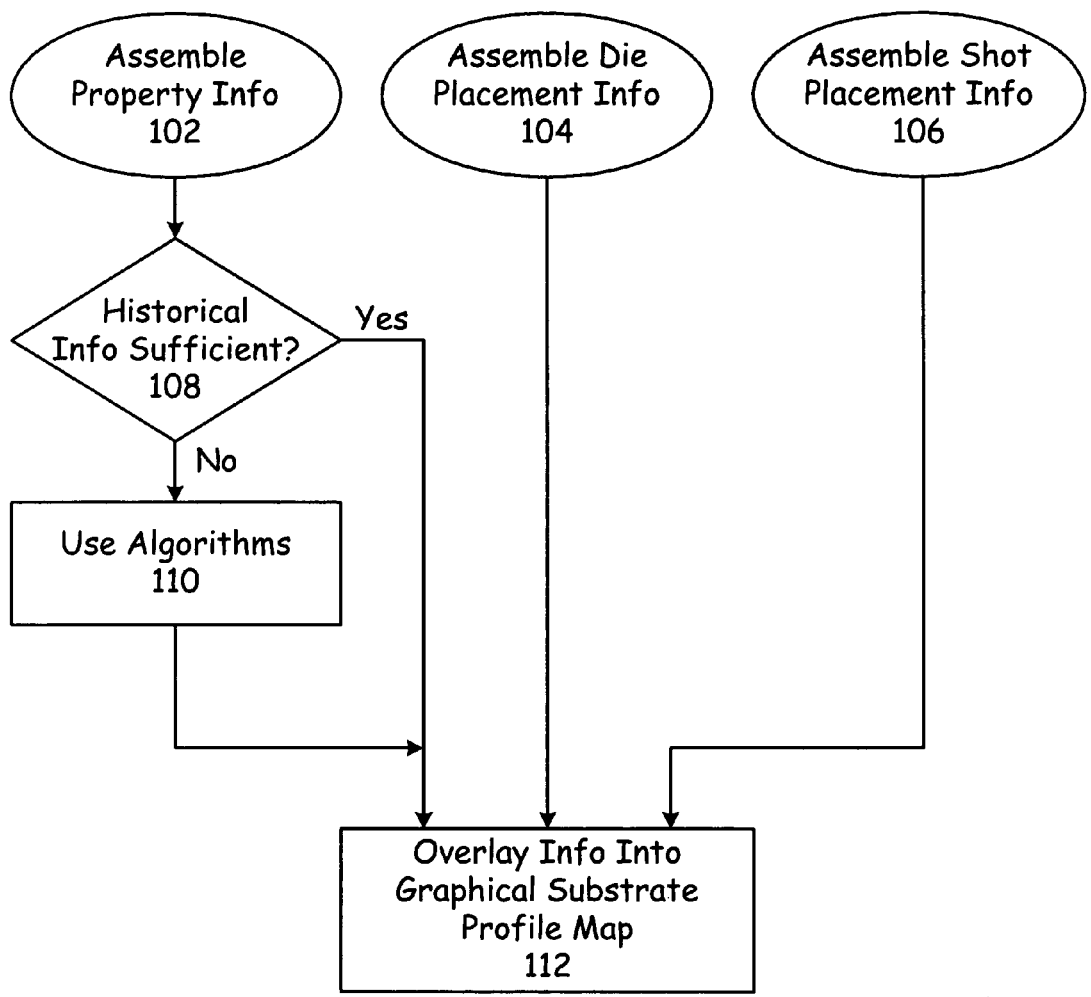
FIG. 2 is a flow chart of a method for producing a graphical profile map according to a preferred embodiment of the invention.

FIG. 2 depicts a flow chart for a preferred method 100 of producing the graphical profile map 10 according to the present invention. Integrated circuit property information is assembled, as given in block 102. Most preferably, a database of historical integrated circuit property information for relevant integrated circuits is interrogated, as given in block 108, to determine whether it has a sufficient amount of information from which to fabricate the integrated circuit property information contours 18. If the database of historical integrated circuit property information does have sufficient information, then this information is used in the overlay of the graphical profile map 10, as given in block 112.

However, if there is not sufficient historical integrated circuit property information in the database, then algorithms are used to generate data that is used to fabricate the integrated circuit property information contours 18, as given in block 110. There may not be sufficient historical integrated circuit property information in the database when, for example, the process is very new, or a process change that effects the given integrated circuit property information has recently been made. In such cases, the historical integrated circuit property information may not produce integrated circuit property information contours 18 that are very informative. When this is so, then the integrated circuit property information contours 18 are preferable formed using algorithms.

The algorithms most preferably include modification algorithms and smoothing algorithms. Examples of such algorithms are linear interpolation and extrapolation. The modification algorithms preferably modify the existing historical integrated circuit property information in a manner that is preferably more consistent with a larger database of information. The smoothing algorithms preferably increase the number of data points used in a manner where the contours 18 are not as abrupt or of so great a range as would typically be produced by a relatively small data set. The algorithms are most preferably tailored, such as by using a recipe, under the direction of an engineer.

For example, an algorithm may be written so as to allow an engineer to manually update the yield for a given area on a substrate. An example of when this might be useful is when a change has recently been made to a given process to correct a historical problem that effects yield. The historical data generated prior to the process change would tend to skew the graphical depiction of yield on the graphical profile map 10, and thus it may be desired to compensate specific portions of the graphical profile map 10 using an algorithm, without changing the data for all of the graphical profile map 10. This can also be useful when an engineer is running "what if" scenarios that effect all or just portions of the graphical profile map 10.

By way of specific example, an engineer may compute the median yield for an entire graphical profile map 10. Next, the engineer can graphically or otherwise select specific portions of the graphical profile map 10, and indicate that the selected portions are to be multiplied by either a fixed or a floating factor to bring them closer to the median yield value that has been calculated. Those areas within the selected portions of the graphical profile map 10 that have lower historical yields may be multiplied by a larger factor to bring them closer to the median yield, and those areas within the selected portions of the graphical profile map 10 that have higher historical yields may be multiplied by a smaller factor to bring them closer to the median yield. Alternately, all selected portions may be multiplied by the same factor, regardless of their historical yield. Further yet, all selected portions may be set to a specific yield value by the algorithm.

Preferably, a set of various algorithms can be written and stored, and then a desired algorithm can be selected as desired for producing a given graphical profile map 10. In this manner, algorithms that are tailored for various processes, integrated circuits, or in support of other parameters can be used as desired. Further, different algorithms can be used on the same data sets and with the same die and shot information, which will produce different graphical profile maps 10, which can then be compared. In this manner, various scenarios can be postulated, which may provide a more accurate prediction of future yields.

Die placement information is also assembled, as given in block 104, such as from the die formation information that is available. Finally, the shot placement information is also assembled, as given in block 106, such as from the mask and shot information that is available. As mentioned above, all of the above information is preferably overlaid into the graphical profile map 10 as given in block 112.

The graphical profile map 10 is preferably presented in one or more of a variety of ways. For example, the graphical profile map 10 may be presented on the display of a dedicated apparatus that is used to produce the graphical profile map 10. Alternately, the graphical profile map 10 may be presented on the display of a personal computer, or other computer terminal, that is running software which is able to produce the graphical profile map 10. The graphical profile map 10 may also be printed out, or stored on a computer readable media, such as in a jpeg or any one or more of a variety of other graphical formats.

The integrated circuit property information 102 used to construct the graphical profile map 10 may be of different types. For example, the integrated circuit property information 102 may be for just a single process that the integrated circuits have undergone, or for all of the processes used to produce the integrated circuits, or for just a selectable subset of the processes that are so used. When the integrated circuit property information for all processes is used, the graphical profile map 10 provides information in regard to the various interactions between all processes in a manner that is very readily assimilated.

Figure 3:
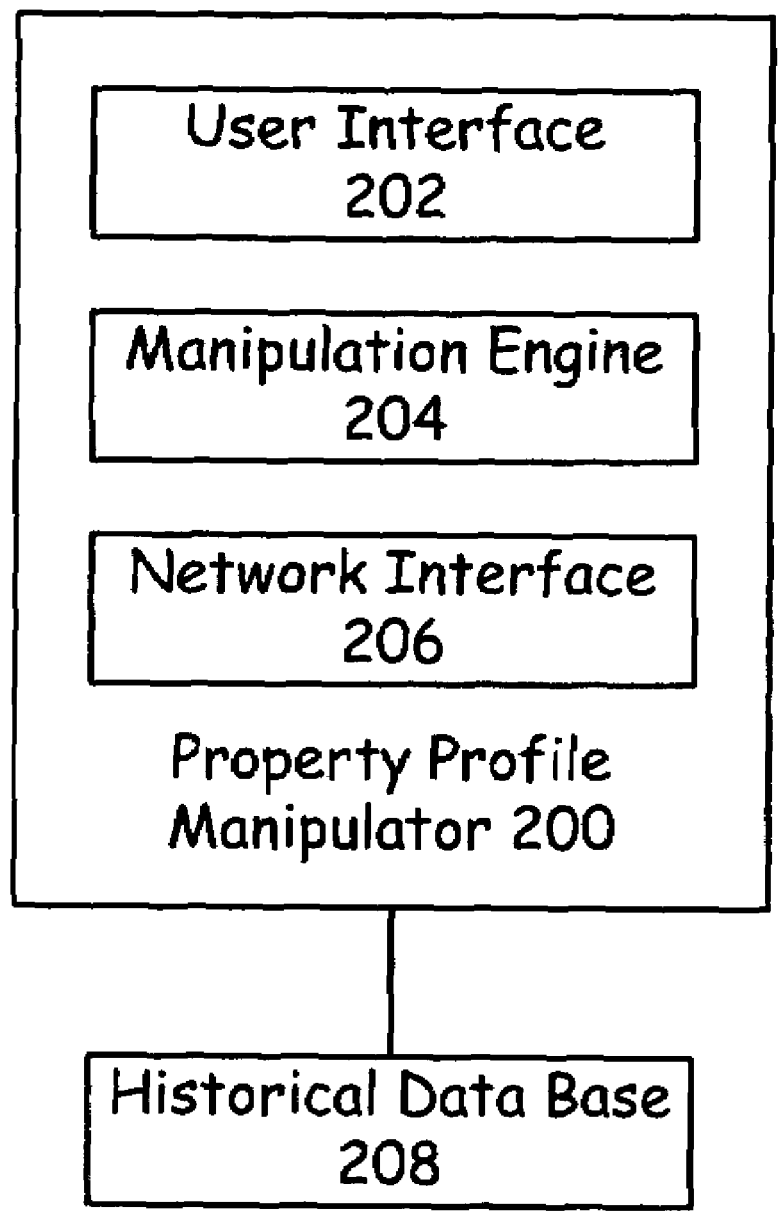
FIG. 3 is a functional block diagram of an apparatus for producing a graphical profile map according to a preferred embodiment of the invention.

FIG. 3 depicts a functional block diagram of a profile manipulator 200 that can be used to produce the graphical profile map 10. The profile manipulator 200 preferably includes a user interface 202, through which parameters can be input, such as by a user who is producing a graphical profile map 10, or an engineer who is entering information that specifies various details in regard to how the graphical profile map 10 will be fashioned. A manipulation engine 204 preferably runs the algorithms as describe above, as needed, and also contains logic necessary to construct the graphical representations. Most preferably, a network interface 206 is used to access the data that is needed to construct the graphical profile map 10, such as the historical data base 208, and the data bases from which the die placement information and shot placement information are taken. Most preferably, the profile manipulator 200 can also be used to move the die and shot placement boundaries on the substrate 12, such that the engineer can determine the best placements to maximize one or more of the properties, such as yield.

The invention as described herein can be embodied in a dedicated profile manipulator, which produces the graphical profile maps 10 as described herein, or in a computer program such as can run on a generalized computing platform, such as a personal computer, or in a method which is accomplished manually. Further, the graphical profile map 10 itself can take a variety of forms, such as a representation presented on a display, or a figure that is printed out on a piece of paper.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A graphical profile map for integrated circuits on a substrate, the graphical profile map comprising an overlaid depiction of:
   a top plane view of the entire substrate,
   all die placement boundaries for the integrated circuits on the substrate,
   all shot placement boundaries for the integrated circuits on the substrate, and
   integrated circuit property information close-bounded contour lines, where the contour lines are not limited in placement to the die placement boundaries and the contour lines are not limited in placement to the shot placement boundaries.

2. The graphical profile map of claim 1, wherein the integrated circuit property information is provided from a database of historical integrated circuit property information when a desired amount of historical integrated circuit property information is available, and when the desired amount of historical integrated circuit property information is not available, additional integrated circuit property information is provided by programmable algorithms.

3. The graphical profile map of claim 2, wherein the programmable algorithms comprise modification algorithms and smoothing algorithms and the algorithms are implemented by at least one of manually by an engineer, automatedly by an intelligent agent, and automatedly by an intelligent script.

4. The graphical profile map of claim 1, wherein the graphical profile map is stored as an image file on a computer readable media.

5. The graphical profile map of claim 1, wherein the integrated circuit property information comprises composite integrated circuit property information for all processes that the integrated circuits have undergone.

6. The graphical profile map of claim 1, wherein the integrated circuit property information comprises integrated circuit property information for a selectable single process that the integrated circuits have undergone.

7. The graphical profile map of claim 1, wherein the integrated circuit property information comprises integrated circuit property information for a selectable subset of processes that the integrated circuits have undergone.

8. The graphical profile map of claim 1, wherein the integrated circuit property information is presented by representing different integrated circuit property information value ranges with different colors.

9. The graphical profile map of claim 1, wherein the integrated circuit property information comprises yield information.

10. The graphical profile map of claim 1, wherein the shot placement boundaries comprise a graphical shot grid representation.

11. The graphical profile map of claim 1, wherein the die placement boundaries comprise a graphical die grid representation.

12. The graphical profile map of claim 1, further comprising a graphical indication depicting an offset from a center of the substrate to a center of a closest unit of the shot placement boundaries.

* * * * *